(12) United States Patent
Lu et al.

(10) Patent No.: US 10,511,064 B2
(45) Date of Patent: Dec. 17, 2019

(54) BATTERY HAVING DISPLAY FUNCTION AND ELECTRONIC DEVICE CONTAINING SAME

(71) Applicant: Feitian Technologies Co., Ltd., Beijing (CN)

(72) Inventors: Zhou Lu, Beijing (CN); Huazhang Yu, Beijing (CN)

(73) Assignee: Feitian Technologies Co., Ltd., Beijing (CN)

( * ) Notice: Subject to any disclaimer, the term of this patent is extended or adjusted under 35 U.S.C. 154(b) by 29 days.

(21) Appl. No.: 15/779,581

(22) PCT Filed: Dec. 6, 2016

(86) PCT No.: PCT/CN2016/108627
§ 371 (c)(1),
(2) Date: May 29, 2018

(87) PCT Pub. No.: WO2017/128864
PCT Pub. Date: Aug. 3, 2017

(65) Prior Publication Data
US 2019/0334212 A1   Oct. 31, 2019

(30) Foreign Application Priority Data
Jan. 29, 2016 (CN) .......................... 2016 1 0065446

(51) Int. Cl.
*G02F 1/1335* (2006.01)
*H01M 10/42* (2006.01)
(Continued)

(52) U.S. Cl.
CPC ........ *H01M 10/425* (2013.01); *G02F 1/1339* (2013.01); *G02F 1/133528* (2013.01);
(Continued)

(58) Field of Classification Search
CPC ......... G02F 1/133528; G02F 1/133553; G02F 1/134309; G02F 1/1339
See application file for complete search history.

(56) References Cited

U.S. PATENT DOCUMENTS 6,428,931 B1   8/2002 Golovin
9,093,382 B2 *  7/2015 Liu ...................... H01L 31/053
(Continued)

*Primary Examiner* — Dung T Nguyen
(74) *Attorney, Agent, or Firm* — Hammer & Associates, P.C.

(57) ABSTRACT

A battery having a display function comprises a volatile display layer, a substrate layer (107), and a power supply layer. The substrate layer (107) is located between the volatile display layer and the power supply layer. The volatile display layer comprises a reflector (108), a first polarizer (112), a first optical film (113), a first electrode layer (117), a display medium layer (114), a second electrode layer (118), a second optical film (115), and a second polarizer (116). The power supply layer comprises a first electrode current collector (101), a first electrode material (102), an electrolyte (103), a second electrode material (104), and a second electrode current collector. The substrate layer (107) is a printed circuit board (PCB) substrate (107). By reusing an electrode current collector (105) of a battery as one surface layer of a PCB and realizing a display function on another surface layer of the PCB, the present invention achieves a display function of an electronic device, with no need for an additional display. In this way volume limitations of the battery and display in an electronic device can be reduced while boosting battery capacity and improving user experience.

17 Claims, 5 Drawing Sheets

(51) Int. Cl.
*H05K 1/18* (2006.01)
*G02F 1/1343* (2006.01)
*G02F 1/1339* (2006.01)
*H05K 1/14* (2006.01)

(52) U.S. Cl.
CPC .. *G02F 1/133553* (2013.01); *G02F 1/134309* (2013.01); *H05K 1/181* (2013.01); *G02F 2001/133565* (2013.01); *H05K 1/142* (2013.01); *H05K 2201/10037* (2013.01)

(56) References Cited

U.S. PATENT DOCUMENTS

2018/0054902 A1* 2/2018 Lu ........................... H01M 2/06
2018/0138558 A1* 5/2018 Lu ........................ G02F 1/1337

\* cited by examiner

BATTERY HAVING DISPLAY FUNCTION AND ELECTRONIC DEVICE CONTAINING SAME

FIELD OF THE INVENTION

The present invention relates to a battery with displaying function and an electronic device which includes the battery, which belongs to the field of electronic technology.

PRIOR ART

With the development of the electronic technology, more and more sorts of electronic devices come out to daily life.

At the moment, the electronic device usually includes a displayer and a battery, and the displayer and the battery are set in the electronic device independently because the two cannot be integrated in one electronic component.

When it comes to portability, the electronic device becomes smaller and smaller, we need to shrink the volume of the battery and/or the volume of the displayer so as to shrink the volume of the electronic device.

However, the smaller the battery becomes, the less the electric quantity of the battery has; in this case, the battery needs to be charged or replaced very often, making users inconvenient.

On the other hand, the smaller the displayer becomes, the less information the electronic device displays; also making users less convenient.

SUMMARY OF THE INVENTION

The object of the invention is to provide a battery with a displaying function, in which even if keeping the volume of the electronic device same, the volume of the battery can become larger and the electronic quantity of the battery can be larger.

The other object of the present invention is to provide an electronic device with the said battery, which does not need to be equipped with an additional displayer, in this case, the volume of the displayer can be larger without adding the volume of the electronic device. Thus it is more convenient for the users.

Thus, according to one aspect of the present invention, it provides a battery with a displaying function, which includes a volatile displaying layer, a substrate layer and a power layer, and the substrate layer is located between the volatile display layer and the power layer;

the volatile display layer includes a reflector, a first polarizer, a first optical film, a first electrode layer, a display-dielectric layer, a second electrode layer, a second optical file and a second polarizer, the reflector is located between the substrate layer and the first polarizer, the first polarizer is located between the reflector and the first optical film, the first optical film is located between the first polarizer and the first electrode layer, the first electrode layer is located between the display-dielectric layer and the first optical film, the display-dielectric layer is located between the first electrode layer and the second electrode layer, the second electrode layer is located between the second optical film and the display-dielectric layer, and the second optical film is located between the display-dielectric layer and the second polarizer; the first electrode layer is coated on a first surface of the first optical film, and the second electrode layer is coated on a second surface of the second optical film, the first surface and the second surface contacts the display-dielectric layer respectively, the display-dielectric layer is filled with a displaying unit, and both the second optical film and the second electrode layer are made from transparent material;

the power layer includes a first electrode current collector, a first electrode material, electrolyte, a second electrode material and a second electrode current collector, the electrolyte is located between the first electrode material and the second electrode material, the first electrode material is located between the first electrode current collector and the electrolyte, the second electrode material is located between the second electrode current collector and the electrolyte;

the substrate layer is PCB substrate, both the second electrode current collector and the reflector are coated on the PCB substrate, the second electrode current collector, the PCB substrate and the reflector construct a PCB construction.

Preferably, the first polarizer parallels the second polarizer.

Preferably, the second polarizer is made from transparent material.

Preferably, the display-dielectric layer is within an enclosed space which is closed by the first optical film and the second optical film.

Preferably, both the second electrode current collector and the reflector are conducting medium which are coated on the PCB substrate, the second electrode current collector, the PCB substrate and the reflector are constructed into a PCB construction.

Preferably, the first electrode layer includes a first electrode and a first electrode cable which connects to the first electrode, the second electrode layer includes a second electrode and a second electrode cable which connects to the second electrode, the first electrode is under the display-dielectric layer and the second electrode is above the display dielectric layer.

Preferably, the battery further includes a first interconnecting piece;

the first electrode connects to the first interconnecting piece through the first electrode cable, and obtains exterior power supply via the first interconnecting piece; the second electrode connects to the first interconnecting piece through the second electrode cable, and obtains exterior power supply via the first interconnecting piece.

Preferably, the first interconnecting piece connects to the first electrode layer which connects to the second electrode layer through a laminating part.

Preferably, the first electrode cable includes a direct connected cable and a transit cable, the direct connected cable connects to the first electrode, and the transit cable connects to the second electrode cable through the laminating part.

Preferably, the first interconnecting piece, which is set on the first optical film, is on the edge of the battery, both the direct connected cable and the transit cable connect to the first interconnecting piece, the first electrode connects to the first interconnecting piece through the direct connected cable, and obtains exterior power supply via the first interconnecting piece; the transit cable connects to the second electrode cable through laminating part, and obtain exterior power supply via the first interconnecting piece.

Preferably, the first electrode cable and the second electrode cable connect to the conducting medium included in the first interconnecting piece respectively.

Preferably, the battery further includes a first electrode lead and a second electrode lead; the second electrode current collector and the first electrode current collector is located on the same plane with the second electrode lead, the second electrode lead conducts with the second electrode current collector, the first electrode lead conducts with the first electrode current collector, and insulates from the second electrode lead.

Preferably, the battery further includes a second interconnecting piece;

the second interconnecting piece, which is set on the PCB substrate, is at the edge of the battery, the second interconnecting piece connects to the first electrode lead through a wire and a hole in the reflector, and connects to the second electrode lead or to the edge of the second electrode current collector through the wire and the hole in the reflector.

Preferably, there is provided with a first hole between the reflector and the first electrode lead, there is provided with a second hold between the reflector and the second electrode lead or the edge of the second electrode current collector, the second interconnecting piece connects to the first electrode lead through the first hole and the wire in the reflector, and the second interconnecting piece connects to the second electrode lead or the edge of the second electrode current collector through the second hold and the wire in the reflector.

According to the other aspect of the invention, it provides an electric device with the said battery, which further includes a main circuit board which is laid on one or multiple of electronic components, the battery connects to the main circuit board through the first interconnecting piece which is on the edge of the battery, and interacts information with at least one electronic component on the main circuit board.

Preferably, the battery connects to the main circuit board through the second interconnecting piece on the edge of the battery, and supplies power to at least one electronic component on the main circuit board.

Preferably, the electronic device further includes an assistant circuit board which connects to the main circuit board through a third interconnecting piece on the edge of the assistant circuit board, one or multiple of electronic components is laid on the assistant circuit board.

According to the present invention, an electrode current collector in the battery is multiplexed as one surface of a printed circuit board, and the other surface of the printed circuit board has a displaying function, in this way, the displayer and the battery can be integrated, thus, the electronic device does not need to be equipped an extra displayer. The said electronic device can be used conveniently without the limit of the volume of the battery and the displayer on the said electronic device.

DETAILED DESCRIPTION OF EMBODIMENTS

The technical solution in embodiments of the present invention is further described more clearly and completely with the drawings of the present invention. Apparently, Embodiments described herein are just a few Embodiments of the present invention. On the basis of Embodiments of the invention, all other related Embodiments made by those skilled in the art without any inventive work belong to the scope of the invention.

According to one embodiment of the present invention, it provides a battery with displaying function, which includes a volatile display layer, a substrate layer and a power layer, and the substrate layer is located between the volatile display layer and the power layer.

In the battery, the volatile display layer includes a reflector, a first polarizer, a first optical film, a first electrode layer, a display dielectric layer, a second electrode layer, a second optical film and a second polarizer, the reflector is located between the substrate layer and the first polarizer, the first polarizer is located between the reflector and the first optical film, the first optical film is located between the first polarizer and the first electrode layer, the first electrode layer is located between the display dielectric layer and the first optical film, the display dielectric layer is located between the first electrode layer and the second electrode layer, the second electrode layer is located between the second optical film and the display dielectric layer, the second optical film is located between the display dielectric layer and the second polarizer; the first electrode layer is coated on a first surface of the first optical film, the second electrode layer is coated on a second surface of the second optical film, the first surface and the second surface connects to the display dielectric layer respectively, which is filled with a displaying unit, the second optical film and the second electrode layer are made from transparent material.

The power layer includes a first electrode current collector, a first electrode material, electrolyte, a second electrode material and a second electrode current collector, the electrolyte is located between the first electrode material and the second electrode material, the first electrode material is located between the first electrode current collector and the electrolyte, the second electrode material is located between the second current collector and the electrolyte.

The substrate layer is PCB substrate, the second electrode current collector and the reflector are coated on the PCB substrate, the second electrode current collector, and the PCB substrate and the reflector construct the PCB construction.

Figure 1:
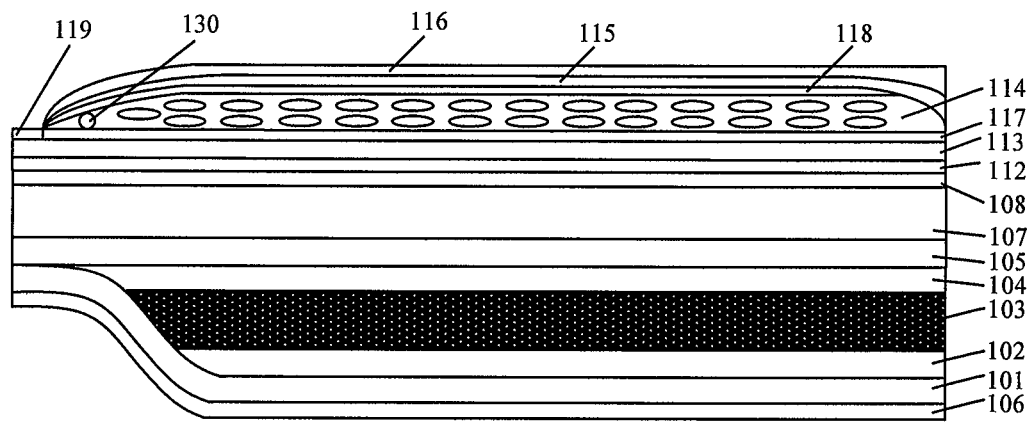
FIG. 1 provides a profile of a battery with a displaying function according to one embodiment of the present invention.

As shown in FIG. 1, it provides a profile of the battery with a displaying function, which includes the first electrode current collector 101, the first electrode material 102, electrolyte 103, the second electrode material 104, the second electrode current collector 105, an insulating layer 106, Print Circuit Board (PCB) substrate 107, the reflector 108, the first polarizer 112, the first optical film 113, the display dielectric layer 114, the second optical film 115, the second polarizer 116, the first electrode layer 117 and the second electrode 118. The electrolyte 103 is located between the first electrode material 102 and the second electrode material 104, the first electrode material 102 is located between the first electrode current collector 102 and the electrolyte 103, the second electrode material 104 is located between the second electrode material 105 and the electrolyte 103, the first electrode current collector 101 is located between the insulating layer 106 and the first electrode material 102, the second electrode current collector 105 is located between the second electrode material 104 and the PCB substrate 107, the PCB substrate 107 is located between the second electrode current collector 105 and the reflector 108, the reflector 108 is located between the PCB substrate 107 and the first polarizer 112, the first polarizer 112 is located between the reflector 108 and the first optical film 113, the first optical film 113 is located between the first polarizer film 112 and the display dielectric layer 114, the display dielectric layer 114 is located between the first optical film 113 and the second optical film 115, the second optical film 115 is located between the display dielectric 114 and the second polarizer 116, the first electrode layer 117 is located on the first surface of the first optical film 113, the first surface contact to the display dielectric layer 114, the second electrode layer 118 is located on the second surface of the second optical film 115, and the second surface contacts to the display dielectric layer 114.

In the battery, the first polarizer 112 parallels with the second polarizer 116, the second optical film 115, the second polarizer 116 and the second electrode layer 118 can be made from transparent materials which can transmit the light irradiating on the second polarizer 116; the display dielectric layer 114 is in the enclosed space constructed between the first optical film 113 and the second optical film 115, the display dielectric layer 114 is filled with liquid crystal molecule. Both the second electrode current collector 105 and the reflector 108 can be the conducting dielectric, such as copper foil, which is coated on the PCB substrate 107. The second electrode current collector 105, the PCB substrate 107 and the reflector 108 construct the PCB construction which is a flexible PCB, and the PCB construction can be a double-sided PCB or a multiple-layered PCB; the insulating layer 106 seals the edge of the battery.

Figure 2:
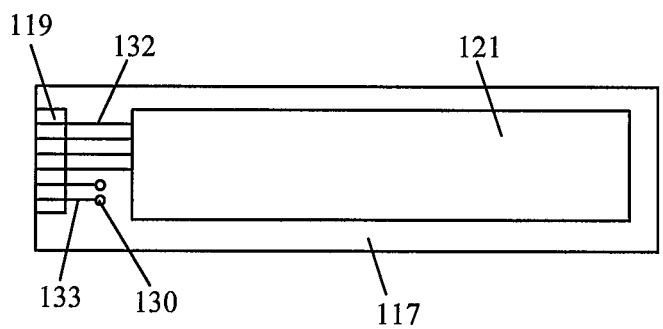
FIG. 2 provides a plane structure schematic diagram of a first interconnecting piece and a first electrode layer according an embodiment of the present invention.
Figure 3:
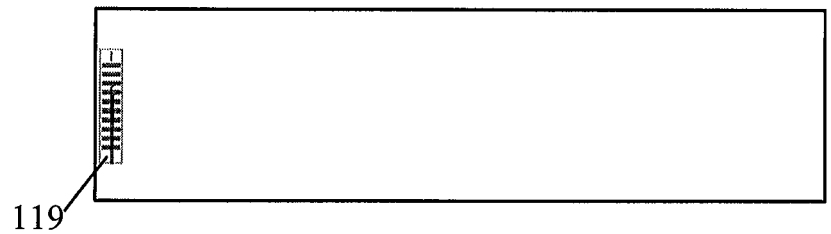
FIG. 3 provides a top view of a battery with a displaying function according an embodiment of the present invention.

Furthermore, as shown in FIG. 2, the first electrode layer 117 includes a first electrode 121 and a first electrode cable which connects to the first electrode 121, the second electrode layer 118 includes a second electrode 122 and a second electrode cable which connects to the second electrode 122, in which, the first electrode includes a direct connected cable 132 and a transit cable 133, the direct connected cable 132 connects to the first electrode 121, the transit cable 133 connects to the second electrode cable through a laminating part 130, and the second electrode cable connects to the second electrode 122; the first electrode 121 is located under the display dielectric 114 and the second electrode 122 is on the top of the display dielectric 114, and both of them apply voltage to the display dielectric layer 114. According to the embodiment of the present invention, the battery further includes a first interconnecting piece 119, as shown in FIG. 1 and FIG. 3, correspondingly, the first electrode 121 connects to the first interconnecting piece 119 via the first electrode cable, and obtain exterior power supply through the first interconnecting piece 119; the second electrode 122 connects to the first interconnecting piece 119 via the second electrode cable, and obtains exterior power supply through the first interconnecting piece 119; the first interconnecting piece 119 connects to the first electrode layer 117 which connects to the second electrode layer 118 through the laminating part 130, the laminating part 130 can be a metallic ball, such as golden ball, or be another conducting dielectric.

Specifically, the first interconnecting piece 119 is located on the edge of the battery, and can be set on the first optical film 113; both the direct connected cable 132 and the transit cable 133 in the first electrode layer 117 connect to the first interconnecting piece 119, the first electrode 121 connects to the first interconnecting piece 119 via the direct connected cable 132, and obtains exterior power supply through the first interconnecting piece 119; the transit cable 133 connects to the second electrode cable in the second electrode layer 118 via the laminating part 130, the second electrode 122 connects to the first interconnecting piece 119 through the second electrode cable and the transit cable 133, and obtains exterior power supply through the first interconnecting piece 119.

In the battery, the first interconnecting piece 119 can be an edge connector which is also known as a connecting finger, the first electrode cable and the second electrode cable connects to the conducting dielectric included in the first interconnecting piece 119 respectively, the conducting dielectric can be a copper pad or another conducting dielectric.

Figure 4:
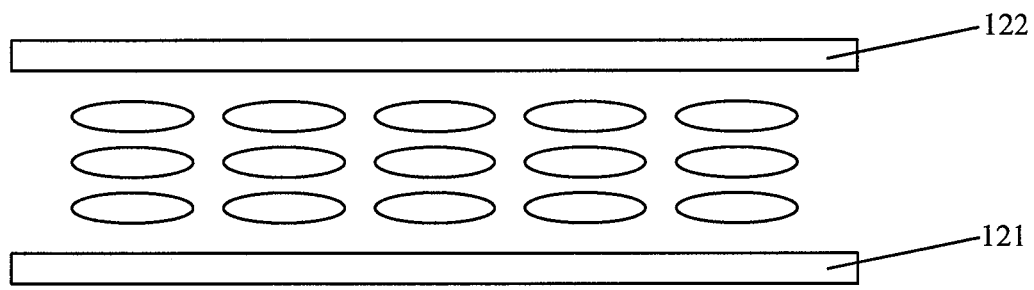
FIG. 4 provides one profile of a display dielectric layer according to an embodiment of the present invention.

In the case that the voltage between the first electrode 121 and the second electrode 122 is lower than a threshold voltage, the liquid crystal molecule in the display dielectric layer parallels with the first electrode layer 117 and the second electrode layer 118, as shown in FIG. 4. The light irradiating on the second polarizer 116 becomes an exterior light of a linear polarization when it goes through the second polarizer 116, the exterior light will deflect for 90 degree when it goes through the display dielectric layer 114 because the orientation of the liquid crystal molecule, thus the exterior light cannot reach the first polarizer 112 and the reflector 108, a corresponding figure cannot be displayed because the exterior light cannot be reflected by the reflector 108.

Figure 5:
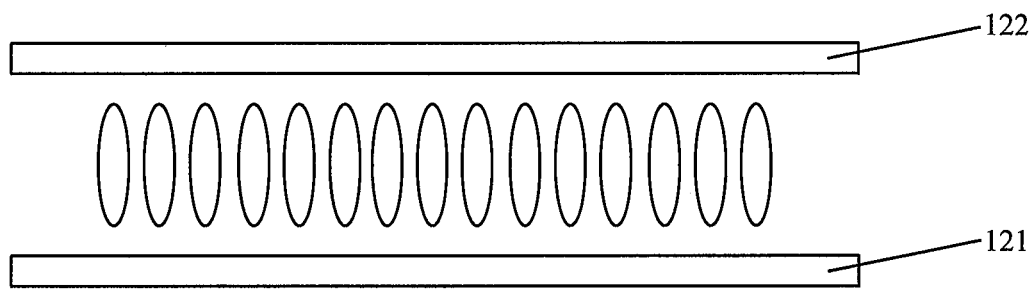
FIG. 5 provides another profile of the display dielectric layer according to an embodiment of the present invention.

In the case that the voltage between the first electrode 121 and the second electrode 122 is not lower than the threshold voltage, the liquid crystal molecule in the display dielectric layer 114 goes along the direction of the voltage between the first electrode 121 and the second electrode 122, as shown in FIG. 5. The light irradiating on the second polarizer 116 becomes the exterior light of the linear polarization after the light goes through the second polarizer 116, and the exterior light will not change the polarization direction when it through the display dielectric layer 114, and the light will be reflected by the reflector 108 after it through the display dielectric layer 114 and the first polarizer 112, thus a corresponding figure will be displayed.

Figure 6:
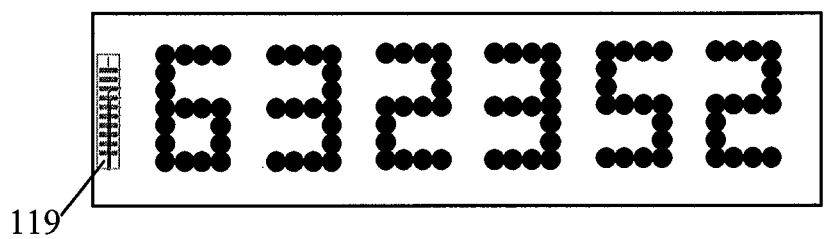
FIG. 6 provides one displaying design sketch of a battery with displaying function according to an embodiment of the present invention.
Figure 7:
FIG. 7 provides another displaying design sketch of a battery with displaying function according to an embodiment of the present invention.

It needs to be noted that both the first electrode 121 and the second electrode 122 can be segment electrodes or dot-matrix electrodes. In the case that both the first electrode 121 and the second electrode 122 are dot-matrix electrodes, the battery is displayed in a mode of dot-matrix in a displaying area corresponding to the first electrode 121 and the second electrode 122 according to the embodiment of the present invention if the voltage between the first electrode 121 and the second electrode 122 is not lower than the threshold voltage, as shown in FIG. 6. In the case that both the first electrode 121 and the second electrode 122 are segment electrodes, the battery is displayed in a mode of segment in the displaying area corresponding to the first electrode 121 and the second electrode 122 according to an embodiment of the present invention if the voltage between the first electrode 121 and the second electrode 122 is not lower than the threshold voltage, as shown in FIG. 7.

Figure 8:
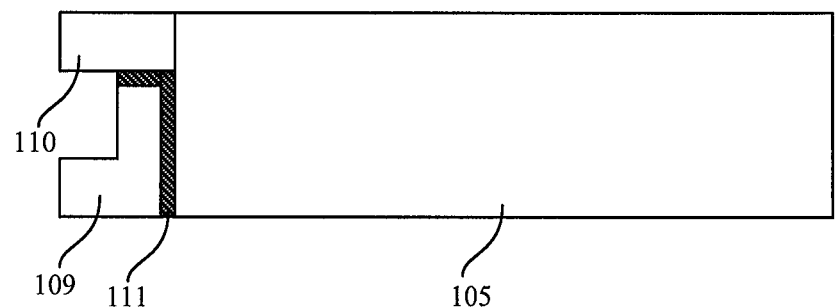
FIG. 8 provides a plane structure schematic diagram of a second electrode current collector according an embodiment of the present invention.

Furthermore, as shown in FIG. 8, the battery in the Embodiment of the present invention includes a first electrode lead 109 and a second electrode lead 110, the second electrode current collector 105 is on a same surface with the first electrode lead 109 and the second electrode lead 110, the second electrode lead 110 conducts with the second electrode current collector 105, and the first electrode lead 109 conducts with the first electrode current collector 101 and insulates with the second electrode current collector 105 and the second electrode lead 110.

Specifically, the battery further includes an insulating tape 111 which is on the same plane with the second electrode current collector 105, the first electrode lead 109 and the second electrode lead 110, and the first electrode lead 109 is insulated from the second electrode current collector 105 and the second electrode lead 110 by the insulating tape 111.

Figure 9:
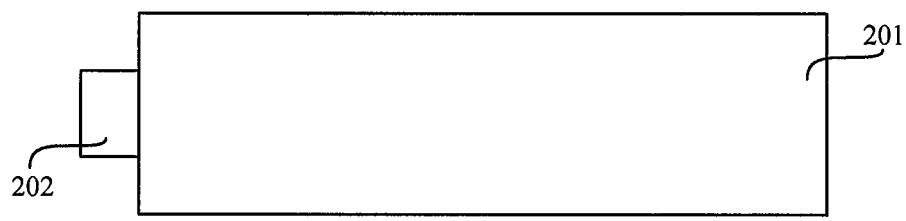
FIG. 9 provides a plane structure schematic diagram of a first electrode current collector according to an embodiment of the present invention.

Correspondingly, the first electrode current collector 101 includes a gluing part 201 and a protuberant part 202, as shown in FIG. 9, the gluing part 201 glues with the first electrode material 102, and the protuberant part 202 glues with the first electrode lead 109.

Figure 10:
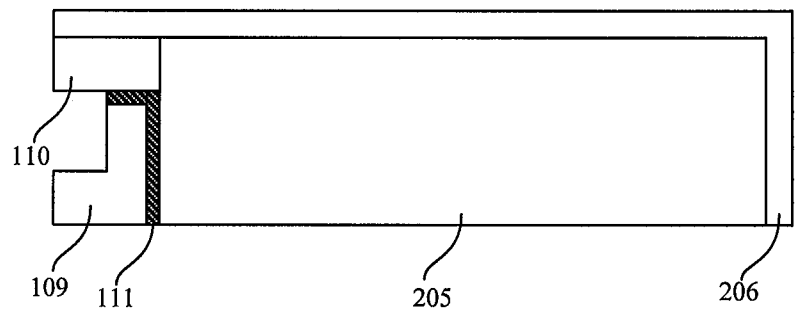
FIG. 10 provides a plane structure schematic diagram of a second electrode current collector according to an embodiment of the present invention.

Furthermore, the second electrode current collector 105 includes a central part 205 and an edge part 206, as shown in FIG. 10, the central part 205 glues with the second electrode material 104.

Figure 11:
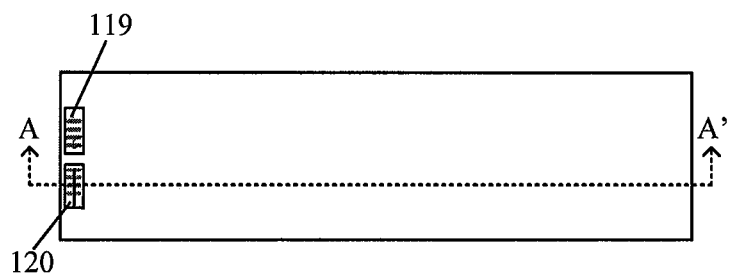
FIG. 11 provides another top view of a battery with displaying function according to an embodiment of the present invention.
Figure 12:
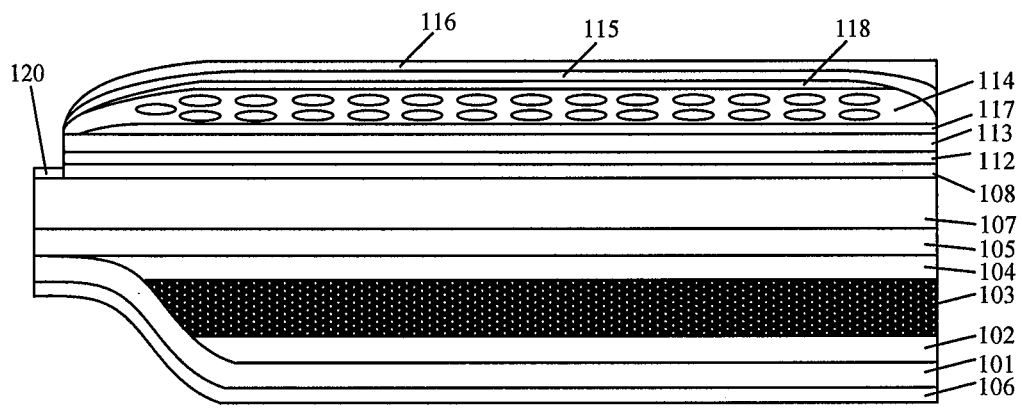
FIG. 12 provides a profile which is obtained by cutting out along A-A' in FIG. 11.

According to the Embodiment of the present invention, the battery further includes a second interconnecting piece 120, as shown in FIG. 11 and FIG. 12, FIG. 12 is a profile which is obtained by cutting out along the line A-A' in FIG. 11, the second interconnecting piece 120, which is set on the PCB substrate 107, is located at the edge of the battery. The second interconnecting piece 120 can connect to the first electrode lead 109 through a cable and a via-hole in the reflector 108, and can also connect to the second electrode lead 110 or to the edge part 206 in the second electrode current collector 105 through the cable and a via-hole in the reflector 108.

Figure 13:
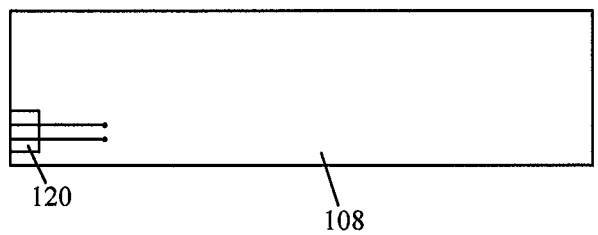
FIG. 13 provides a schematic diagram of the second interconnecting piece and a reflector according to an embodiment of the present invention.

Specifically, there is a first via-hole between the reflector 108 and the first electrode lead 109, there is a second via-hole between the reflector 108 and the second electrode lead 110 or between the reflector 108 an the edge part 206 of the second electrode current collector 105, correspondingly, the second interconnecting piece 120 connects to the first electrode lead 109 through the first via-hole and the cable in the reflector 108, and connects to the second electrode lead 110 or the edge part 206 in the second electrode current collector 105 through the second via-hole and the cable in the reflector 108, as shown in FIG. 13.

According to the Embodiment of the present invention, the electrode current collector in the battery is also used as one surface of the PCB, and the displaying function is realized on the other surface of the PCB, in this way, the displayer and the battery are integrated, thus, the electronic device with the battery does not need to be equipped with an extra displayer; in this way, the electric quantity of the battery of the electronic device can be improved when the volume of the electronic device is not added, it has less limits for the volume of the battery and the displayer in the electronic device and makes more convenient for the user.

Figure 14:
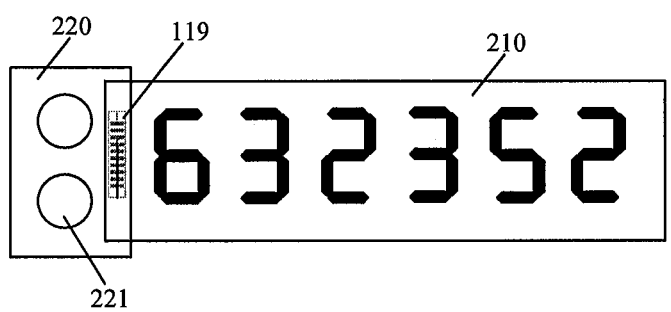
FIG. 14 provides a structure schematic diagram of an electronic device according to an embodiment of the present invention.

Based on the above battery with displaying function, it further provides another electronic device with the above battery according to the Embodiment of the present invention, as shown in FIG. 14, the electronic device includes a battery 210 and a main circuit board 220, one or multiple of electronic components 221 are set on the main circuit board 220, which can be touching keys, resistance, capacitance, metal dome or microprocessor. The battery 210 connects to the main circuit board 220 through the first interconnecting piece at the edge of itself, and transacts information with at least one electronic component 221 on the main circuit board 220. For instance, the battery 210 transacts information with the microprocessor on the main circuit board 220 through the first interconnecting piece 119.

Figure 15:
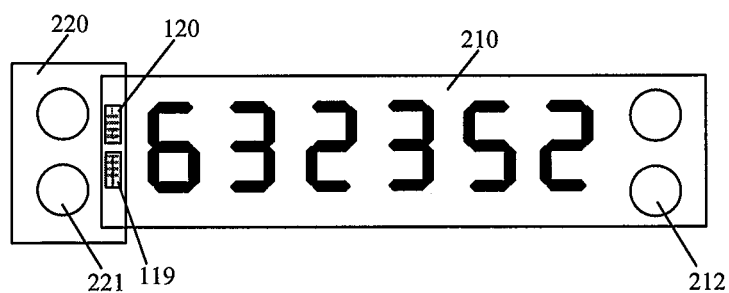
FIG. 15 provides a structure schematic diagram of another electronic device according to an embodiment of the present invention.

Furthermore, the electronic component 212 is welded on the battery 210 through a bonding pad, as shown in FIG. 15, the electronic component 212 connects to the first interconnecting piece 119, and the electronic component 212 can be one or several of touching key, resistance, capacitance, and metal dome.

Specifically, the first interconnecting piece 119 connects to the electronic components 212 through printed cable in the case that the electronic components 212 is on the same layer with the first interconnecting piece 119; the first interconnecting piece 119 connects to the electronic components 212 through the printed cable and the via-hole in the case that the electronic components 212 is not on the same layer with the first interconnecting piece 119.

Furthermore, the battery 210 can connect to the main circuit board 220 through the second interconnecting piece 120 at the edge of the battery, and supply power for at least one electronic component 221 on the main circuit board 220, as shown in FIG. 15.

Figure 16:
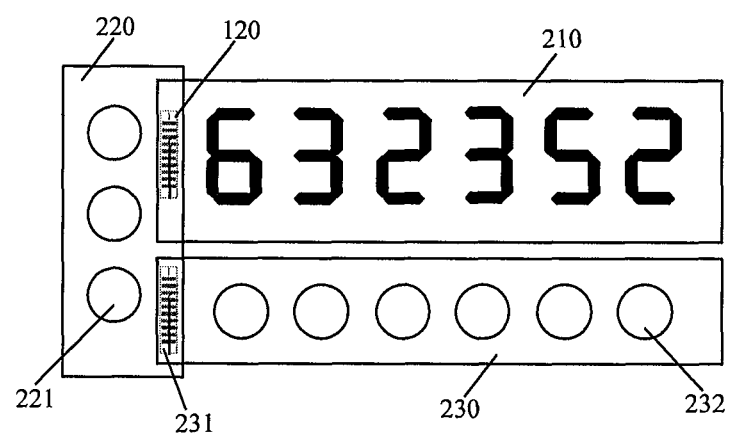
FIG. 16 provides a structure schematic diagram of the third electronic device.

Furthermore, according to the Embodiment of the present invention, the electronic device further includes an assistant PCB 230 which connects to the main PCB 220 through a third interconnecting piece 231 at the edge of the assistant PCB, the assistant PCB 230 is set with one or multiple of electronic components 232, as shown in FIG. 16, and the electronic components 232 connects to the third interconnecting piece 231, and the electronic components 232 can be one or several of touching keys, resistance, capacitance and metal dome.

According to the Embodiment of the present invention, the electrode current collector in the battery is also used as one surface of the PCB, and the displaying function is realized on the other surface of the PCB, in this way, the displayer and the battery are integrated, thus, the electronic device with the battery does not need to be equipped with an extra displayer; in this way, the electric quantity of the battery of the electronic device can be improved when the volume of the electronic device is not added, it has less limits for the volume of the battery and the displayer in the electronic device and makes more convenient for the user.

In other words, according to the present invention, the battery in the electronic components can be larger without no additional volume, thus the electronic quantity can be improved; besides, the volume of the displayer can be larger because no extra displayer need to be equipped, it is more convenient for the user.

The Embodiment described herein is just a preferable Embodiment of the present invention. On the basis of the Embodiment of the invention, all other related Embodiments made by those skilled in the art without any inventive work belong to the scope of the invention.

The invention claimed is:

1. A battery with displaying function, wherein said battery comprises a volatile displaying layer, a substrate layer and a power supply layer, and the substrate layer is located between the volatile display layer and the power supply layer;

the volatile display layer comprises a reflector, a first polarizer, a first optical film, a first electrode layer, a display dielectric layer, a second electrode layer, a second optical film and a second polarizer, the reflector is located between the substrate layer and the first polarizer, the first polarizer is located between the reflector and the first optical film, the first optical film is located between the first polarizer and the first electrode layer, the first electrode layer is located between the display dielectric layer and the first optical film, the display dielectric layer is located between the first electrode layer and the second electrode layer, the second electrode layer is located between the second optical film and the display dielectric layer, the second optical film is located between the display dielectric layer and the second polarizer; the first electrode layer is provided to coat on a first surface of the first optical film, the second electrode layer is provided to coat on a second surface of the second optical film, each of the first surface and the second surface connects to the display dielectric layer, and the display dielectric layer is filled with a displaying unit, and the second optical film and the second electrode layer are both made from transparent material;

the power supply comprises a first electrode current collector, a first electrode material, electrolyte, a second electrode material and a second electrode current collector, the electrolyte is located between the first electrode material and the second electrode material, the first electrode material is located between the first electrode current collector and the electrolyte, and the second electrode material is located between the second electrode current collector and the electrolyte;

the substrate layer is PCB substrate, the second electrode current collector and the reflector are both provided to coat on the PCB substrate, and the second electrode current collector, the PCB substrate and the reflector construct a PCB construction.

2. The battery as claimed in claim 1, wherein the first polarizer parallels the second polarizer.

3. The battery as claimed in claim 1, wherein the second polarizer is made from transparent material.

4. The battery as claimed in claim 1, wherein the display dielectric layer is sealed within an enclosed space by the first optical film and the second optical film.

5. The battery as claimed in claim 1, wherein both the second electrode current collector and the reflector are conducting dielectric which is provided to coat on the PCB substrate, and the second electrode current collector, the PCB substrate and the reflector constructs a PCB construction.

6. The battery as claimed in claim 1, wherein the first electrode layer comprises a first electrode and a first electrode cable which connects to the first electrode, and the second electrode layer comprises the second electrode and the second electrode cable which connects to the second electrode, the first electrode and the second electrode are located under and above the display dielectric layer, respectively.

7. The battery as claimed in claim 6, wherein said battery further comprises a first interconnecting piece;

the first electrode is provided to connect the first interconnecting piece through the first electrode cable and obtain exterior power supply via the first interconnecting piece, and obtaining exterior power supply through the first interconnecting piece; the second electrode is provided to connect the first interconnecting piece via the second electrode cable, and obtain exterior power supply through the first interconnecting piece.

8. The battery as claimed in claim 7, wherein the first interconnecting piece is provided to connect to the first electrode layer, and the first electrode layer is provided to connect to the second electrode layer through a laminating part.

9. The battery as claimed in claim 8, wherein the first electrode cable comprises a direct connected cable and a transit cable, the direct connected cable is provided to connect to the first electrode, and the transit cable is provided to connect to the second electrode cable through the laminating part.

10. The battery as claimed in claim 9, wherein the first interconnecting piece, which is set on the first optical film, is located at an edge of the battery, both the direct connected cable and the transit cable are provided to connect to the first interconnecting piece, the first electrode is provided to connect to the first interconnecting piece through the direct connected cable, and obtain exterior power supply through the first interconnecting piece; the transit cable is provided to connect to the second electrode cable through the laminating part, and the second electrode is provided to connect to the first interconnecting piece through the second electrode cable and the transit cable, and obtain exterior power supply through the first interconnecting piece.

11. The battery as claimed in claim 9, wherein the first electrode cable and the second electrode cable are provided to connect to conducting dielectric included in the first interconnecting piece respectively.

12. The battery as claimed in claim 1, wherein said battery further comprises a first electrode lead and a second electrode lead; the second electrode current collector is on the same plane with the first electrode lead and the second electrode lead, the second electrode lead conducting with the second electrode current collector, the first electrode lead conducting with the first electrode current collector, and the second electrode current collector insulates from the second electrode lead.

13. The battery as claimed in claim 12, wherein said battery further comprises a second interconnecting piece;

the second interconnecting piece, which is set on the PCB substrate, is located at the edge of the battery, the second interconnecting piece is provided to connect to the first electrode lead through a cable and a via-hole in the reflector, and connect to the second electrode lead or the edge of the second electrode current collector through the cable and the via-hole in the reflector.

14. The battery as claimed in claim 13, wherein there is provided with a first via-hole between the reflector and the first electrode lead, and there is provided with a second via-hole between the reflector and the second electrode lead or an edge part of the second electrode current collector, the second interconnecting piece is provided to connect to the first electrode lead through the first via-hole and the cable in the reflector, and connect to the second electrode lead or the edge part in the second electrode current collector through the second via-hole and the cable in the reflector.

15. An electronic device which comprises the battery as claimed in claim 1, wherein said electronic device further comprises a main circuit board which is set with one or multiple electronic components, the battery is provided to connect to the main circuit board through the first interconnecting piece at the edge of the battery, and interacting information with at least one electronic component on the main circuit board.

16. The electronic device as claimed in claim 15, wherein the battery connects to the main circuit board through the second interconnecting piece at the edge of the battery, and supplies power for at least one electronic component on the main circuit board.

17. The electronic device as claimed in claim 15, wherein said electronic device further comprises an assistant circuit board which connects to the main circuit board through a third interconnecting piece at the edge of the assistant circuit board itself, and the assistant circuit board is provided with one or multiple electronic components.

\* \* \* \* \*